United States Patent [19]

Gulczynski

[11] Patent Number: 4,749,953

[45] Date of Patent: Jun. 7, 1988

[54] OPERATIONAL AMPLIFIER OR COMPARATOR CIRCUIT WITH MINIMIZED OFFSET VOLTAGE AND DRIFT

[76] Inventor: Zdzislaw Gulczynski, P.O. Box 441, Winchester, Mass. 01890

[21] Appl. No.: 946,599

[22] Filed: Dec. 24, 1986

[51] Int. Cl.$^4$ .............................................. H03F 1/02
[52] U.S. Cl. ........................................ 330/9; 330/149
[58] Field of Search ................... 330/9, 149, 151, 260, 330/261

[56] References Cited

U.S. PATENT DOCUMENTS 4,439,693 3/1984 Lucas et al. ............................ 330/9

*Primary Examiner*—Gene Wan

[57] ABSTRACT

The invention relates to an operational amplifier (OA) or comparator circuit with minimized offset voltage and drift, particularly for analog and/or digital systems requiring high speed and high accuracy signal processing, such as integrators, analog-to-digital converters, etc. The provided OA and comparators circuits retain a high speed and have a drastically increased accuracy. No correcting amplifier is necessary. The gain set by external components is insignificant. Widely available high speed switching components can be used. The tolerance of the passive components used is not critical. The values of the capacitors are determined by the switching frequency and amount of the input bias current of the employed OA. A FET OA can be used as its very large offset voltage and drift can be easily compensated.

14 Claims, 1 Drawing Sheet

OPERATIONAL AMPLIFIER OR COMPARATOR CIRCUIT WITH MINIMIZED OFFSET VOLTAGE AND DRIFT

CROSS REFERENCE TO RELATED APPLICATONS

This application is related to the applications entitled "Flash Analog-to-Digital Coverter with Integrating Input Stage" Ser. No. 946,693 and "Encoder for Flash Analog-to-Digital Converters" Ser. No. 946,598, filed on even date herewith, the contents of which are hereby incorporated by reference herein, and is also related to the applications entitled "Operational Amplifier" Ser. No. 843,165, filed on 03/24/86 and "Operational Amplifier" Ser. No. 701,640, filed on 02/14/85, now U.S. Pat. No. 4,634,996 issued on 01/06/87. All inventions are by the same inventor.

BACKGROUND AND SUMMARY OF THE INVENTION

The invention relates to an operational amplifier (OA) or comparator circuit with minimized offset voltage and drift, particularly for analog and/or digital systems requiring high speed and high accuracy signal processing, such as integrators, analog-to-digital converters, etc.

An OA is an amplifier having a pair of inputs for amplifying an input signal applied thereto. In particular, an inherent parasitic offset voltage is present between inputs of any OA and depends on temperature, represented by an offset drift, the level of the input signal, represented by a common mode rejection ratio (CMRR), and the frequency of the amplified input signal. Therefore, an error voltage present between the inputs of the OA is a momentary value of the offset voltage.

A reduction of offset voltage and drift of an OA is ordinarily accomplished in a circuit incorporating high speed and precision OAs. An exemplary approach is described in U.S. Pat. No. 4,634,996 by the same inventor.

A combination of fast and accurate techniques in one system results mostly in a greatly decreased speed of fast components, having inherently a poor DC performance, due to a sluggish response of correcting components, introduction of parasitic capacitances, etc. The system structure must be optimized due to specific requirements of precision amplifiers. Other techniques demand so called autozero modes which degrade the system performance. Dynamically generated errors are not meaningfully reduced.

The invention is intended to provide OA and comparator circuits retaining high speed and having a drastically increased accuracy. No correcting amplifier is necessary. The gain set by external components is insignificant. An autozero mode is required only in case of a comparator since that is the only way to accurately obtain its error voltage. Widely available high speed switching components can be used. An ampler circuit according to the present invention includes an amplifier means having a pair of inputs, means for coupling an input signal to the input and including capacitor means coupled in series between the input signal and one of the inputs for storing an error voltage present between the inputs, and means for applying the error voltage across the capacitor means. Throughout the drawings, similar references denote similar parts.

BRIEF DESCRIPTION OF THE DRAWINGS

The present invention will become more clear in conjunction with the accompanying figures of which.

DETAILED DESCRIPTION OF THE INVENTION

Figure 1:
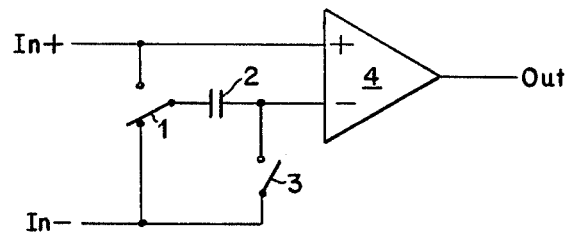
FIG. 1 is a basic structure of the embodiment.

FIG. 1 is a basic structure of the embodiment. The input signal is applied to signal input terminals In+ and In−. Their polarity is determined by the terminal coupled directly to an input terminal of the OA or comparator. It is assumed that an OA is used since a comparator is a kind of an OA.

A capacitor 2 has one end coupled to the inverting input and another end coupled to switch 1 which can be switched either to the In+ or In− input terminals. Switch 3 is closed to connect the inverting input to the In− terminal while switch 1 is connected to the In+ terminal. The OA 4 input terminals may be reversed.

The capacitor 2 is charged to the error voltage of the OA 4 if switch 1 is connected to In+. During this time switch 3 is closed to otherwise couple the input signal to the OA inputs. The voltage between In+ and In− is zero after switching the switch 1 since the error voltage of the OA 4 is added to the capacitor voltage having an opposite polarity.

Figure 2:
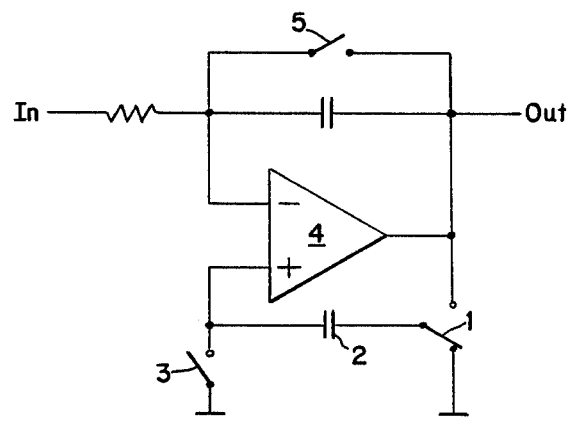
FIG. 2 is an embodiment of an integrator or a comparator.

FIG. 2 is an embodiment of an integrator or a comparator with the input signal referenced to ground. The input and output signals of the integrator are applied to the inverting input of the OA 4 respectively via a resistor and a capacitor which is bridged by the switch 5.

During a usual reset mode of the integrator the switches 3 and 5 are closed and the switch 1 couples the capacitor 2 to the output of the OA 4. The capacitor 2 is charged to the error voltage of the OA 4. During an integration the switches 3 and 5 are open and the capacitor 2 is coupled to ground via the switch 1. The capacitor voltage cancels out the error voltage of the OA 4.

FIG. 2 can also be considered as a comparator circuit, whereby the resistor and the capacitor connected to the inverting input of the OA 4 are superfluous. The mode of operation is analogous; if the switch 5 is closed then the OA 4 (possibly a comparator) is held at its switching point, applying thus its error voltage to the capacitor 2.

Figure 3:
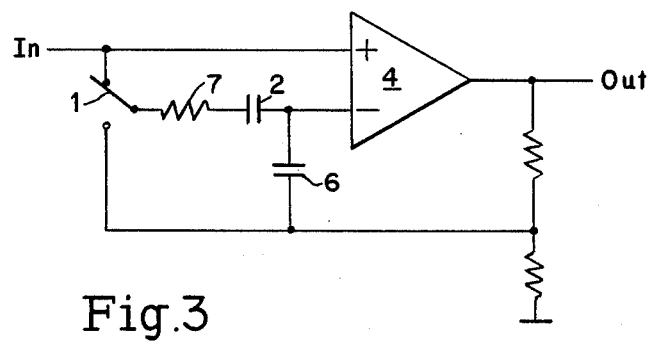
FIG. 3 is an embodiment of a non-inverting amplifier.

FIG. 3 is an embodiment of a non-inverting amplifier, whereby its operation is uninterrupted. The switch 3 is replaced by the capacitor 6 so that a corrective voltage is continuously provided. The capacitor 2 is coupled parallel to the inputs of the OA 4 or to the capacitor 6. By commutating the switch 1 the voltage on the capacitor 6 is constantly updated.

If a switching frequency used for switch 1 is higher than the frequency of the input signal being amplified, a significant improvement of the frequency response of the common mode rejection ratio (CMRR) of the OA results. The dynamic changes of the error voltage of the OA 4 are detected by the capacitor 2, further controlling the charge on the capacitor 6.

The resistor 7 is connected in series with the capacitor 2 for reducing its initial charging current drawn from the input source of the amplifier as well as smoothing out a voltage leap on the capacitor 6 while charging.

The input signal can be applied either to In+ or In−. For instance, the input In and the ground connection can be exchanged. A switch, analogous to the switch 5, can be connected to the output of the OA 4 and one of the terminals of the capacitor 6. The tolerance of the passive components used is not critical and the gain set by the resistor pair is insignificant. A leakage capacitance of the switch 1 should be very low. The values of the capacitors 2 and 6 are determined by the switching frequency and amount of the input bias current of the OA 4. A FET OA is recommended as its very large offset voltage and drift can be easily compensated.

The embodiments of the present invention described herein are intended to be taken in an illustrative and not a limiting sense. Various modifications and changes may be made to these embodiments by persons skilled in the art without departing from the scope of the present invention as defined in the appended claims.

What I claim is:

1. An amplifier circuit, comprising:
   an amplifier means having a pair of inputs and exhibiting an error voltage therebetween;
   means for coupling an input signal to the inputs and including capacitor means coupled in series between the input signal and one of the inputs for storing the error voltage; and
   means for applying the error voltage across the capacitor means.

2. Amplifier circuit of claim 1, wherein the means for applying includes means for coupling the capacitor means across the inputs and means for alternately coupling the input signal to the inputs while the capacitor means is coupled across the inputs.

3. Amplifier circuit of claim 2, wherein the means for coupling includes a pair of input terminals for receiving the input signal with one of the input terminals connected to one of the amplifier means inputs.

4. Amplifier circuit of claim 3, wherein the capacitor means includes a first end connected to the other amplifier means input and a second end, and further wherein the means for applying includes a first switch for alternately connecting the second end of the capacitor means to either the other input terminal or the one input terminal, and a second switch for connecting the other amplifier means input to the other input terminal while the first switch is connected to the one input terminal.

5. Amplifier circuit of claim 3, wherein the capacitor means includes a first end connected to the other amplifier means input and a second end, and further wherein the means for applying includes a first switch for alternately connecting the second end of the capacitor means to either the other input terminal or the one input terminal, and a capacitor coupling the other amplifier means input to the other input terminal.

6. Amplifier circuit of claim 4, wherein the capacitor means includes a second capacitor connected in series with a resistor.

7. Amplifier circuit of claim 1, wherein the amplifier means has an output and one of the pair of inputs is an inverting input, and further wherein the means for applying includes means for coupling the inverting input to the output and means for coupling the capacitor means from the other input to the output.

8. Amplifier circuit of claim 7, wherein the capacitor means includes a first end connected to the other amplifier means input and a second end, and further wherein the means for applying includes a first swtich for alternately connecting the second end of the capacitor means to either the other input terminal or the amplifier means output, and a second switch for connecting the other amplifier means input to the other input terminal while the first switch is connected to the amplifier means output.

9. Amplifier circuit of claim 7, wherein the capacitor means includes a first end connected to the other amplifier means input and a second end, and further wherein the means for applying includes a first switch for alternately connecting the second end of the capacitor means to either the other input terminal or the one input terminal, and a capacitor coupling the other amplifier means input to the other input terminal.

10. Amplifier circuit of claim 9, wherein the capacitor means includes a second capacitor connected in series with a resistor.

11. Amplifier circuit of claim 1, wherein the amplifier means is an operational amplifier.

12. Amplifier circuit of claim 1, wherein the amplifier means is a comparator.

13. Amplifier circuit of claim 1, wherein the means for applying includes a second capacitor means and means for coupling the second capacitor means alternately across the amplifier means inputs and across the first said capacitor means.

14. Amplifier circuit of claim 13, wherein the second capacitor means includes a capacitor connected in series with a resistor and having one end coupled to the one of the amplifier means inputs, and further wherein the means for coupling the second capacitor means includes a switch connected to the other end thereof for alternately connecting the second capacitor means either across the amplifier means inputs or in parallel with the first said capacitor means.

* * * * *